United States Patent [19]
Merritt

[11] Patent Number: 5,828,095
[45] Date of Patent: Oct. 27, 1998

[54] CHARGE PUMP

[75] Inventor: Todd Merritt, Boise, Id.

[73] Assignee: Micron Technology, Inc., Boise, Id.

[21] Appl. No.: 694,256

[22] Filed: Aug. 8, 1996

[51] Int. Cl.$^6$ .................................................. H01L 27/04
[52] U.S. Cl. .......................... 257/299; 257/296; 257/537; 365/149; 365/222; 365/189.01; 365/189.09
[58] Field of Search ...................................... 257/296, 299, 257/537; 365/149, 222, 189.01, 189.09

[56]  References Cited

U.S. PATENT DOCUMENTS

| 4,468,798 | 8/1984 | Riebeek. |
| 5,023,465 | 6/1991 | Douglas et al.. |
| 5,126,590 | 6/1992 | Chern. |
| 5,394,320 | 2/1995 | Blodgett. |
| 5,394,365 | 2/1995 | Tsukikawa. |
| 5,493,249 | 2/1996 | Manning. |
| 5,544,102 | 8/1996 | Tobita et al. ........................ 365/189.09 |
| 5,673,232 | 9/1997 | Furutani ................................... 365/226 |

Primary Examiner—Valencia Wallace
Attorney, Agent, or Firm—Dickstein Shapiro Morin & Oshinsky LLP

[57]  ABSTRACT

Selected transistors in a charge pump circuit have their associated well regions tied to a capacitor electrode. As a result, the body effect in these devices is reduced, and, consequently, the threshold voltage is reduced as well. With a lower threshold voltage, these transistors allow the charge pump to quickly generate a voltage higher than the positive power supply voltage or a negative substrate bias voltage. In addition, the metal-insulator-semiconductor (MIS) capacitors in the charge pump preferably have their source/drain regions tied to an associated well region, thereby shorting the source/drain/well region junction. Thus, parasitic capacitances associated with these MIS capacitors is significantly reduced, further increasing the speed of the charge pump circuit.

22 Claims, 12 Drawing Sheets

CHARGE PUMP

BACKGROUND OF THE INVENTION

The present invention relates to semiconductor memory circuits and to charge pumps in particular. Moreover, this invention relates to a power supply circuit and particularly to systems including pumped power supplies.

System designs are routinely constrained by a limited number of readily available power supply voltages ($V_{CC}$). For example, consider a portable computer system powered by a conventional battery having a limited power supply voltage. For proper operation, different components of the system, such as display, processor, and memory components employ diverse technologies which require power to be supplied at various operating voltages. Components often require operating voltages of a greater magnitude than the power supply voltage and, in other cases, a voltage of reverse polarity. The design of a system, therefore, includes power conversion circuitry to efficiently develop the required operating voltages. One such power conversion circuit is known as a charge pump. The demand for highly-efficient and reliable charge pump circuits has increased with the increasing number of applications utilizing battery powered systems, such as notebook computers, portable telephones, security devices, battery-backed data storage devices, remote controls, instrumentation, and patient monitors, to name a few.

Inefficiencies in conventional charge pumps lead to reduced system capability and lower system performance in both battery and non-battery operated systems. Inefficiency can adversely affect system capabilities, e.g., limited battery life, excess heat generation, and high operating costs. Samples of lower system performance include low speed operation, excessive operating delays, loss of data, limited communication range, and inability to operate over wide variations in ambient conditions including ambient light level and temperature.

In addition to constraints on the number of power supply voltages available for system design, there is an increasing demand for reducing magnitudes of the power supply voltages. The demand in diverse application areas could be met with highly efficient charge pumps that operate from a supply voltage of less than five volts.

Such applications include memory systems backed by 3 volt standby supplies, processor and other integrated circuits that require either reverse polarity substrate biasing or booted voltages outside the range of 0–3 volts for improved operation. As supply voltage is reduced, further reduction of supply of switching components paves the way for new and more sophisticated applications. Consequently, the need for high efficiency charge pumps is increased because voltages necessary for portions of integrated circuits and other system components are more likely to vary over a wide range.

SUMMARY OF THE INVENTION

In accordance with the present invention, a charge pump is provided having a metal-insulator-semiconductor (MIS) capacitor provided with an associated well region. The well region has a second conductivity type opposite the first conductivity type of a substrate. First and second doped regions serving as source and drain regions of the MIS capacitor are provided in the well region in spaced relation and electrically connected to one another. An insulation layer is formed on the primary surface of the substrate overlying respective portions of the first and second doped regions and a portion of the well region between the first and second doped regions. In addition, a conductive layer is provided to short at least one of the first and second doped regions to the well region.

Further, in accordance with the present invention, a charge pump is provided which includes a semiconductor substrate and a well region, having a first conductivity type, provided in the substrate. A transistor has source and drain regions of a second conductivity type in the well region and an insulated gate electrode overlying a portion of the well region between the source and drain regions. In addition, a capacitive storage element is included having a first capacitor electrode electrically connected to the well region to adjust a body effect of the transistor upon application of a voltage signal, and a second capacitor electrode connected to one of the source and drain regions of the transistor.

It is to be understood that both the foregoing general description and the following detailed description are exemplary and explanatory only and are not restrictive of the invention, as claimed.

The accompanying drawings, which are incorporated in and constitute part of the specification, illustrate several embodiments of the invention and together with the description, serve to explain the principles of the inventions.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

In accordance with the present invention, selected transistors in a charge pump circuit have their associated well regions tied to a switched potential node. As a result, the body effect in these devices is reduced, and, consequently, the threshold voltage is reduced as well. With a lower threshold voltage, these transistors allow the charge pump to quickly generate a voltage higher than the positive power supply voltage or a negative substrate bias voltage.

Further, metal-insulator-semiconductor (MIS) capacitors in a charge pump circuit preferably have their source/drain regions tied to an associated well region, thereby shorting the source/drain/well region junction. Thus, the parasitic capacitances associated with these MIS capacitors is significantly reduced, further increasing the speed of the charge pump circuit.

Figure 1:
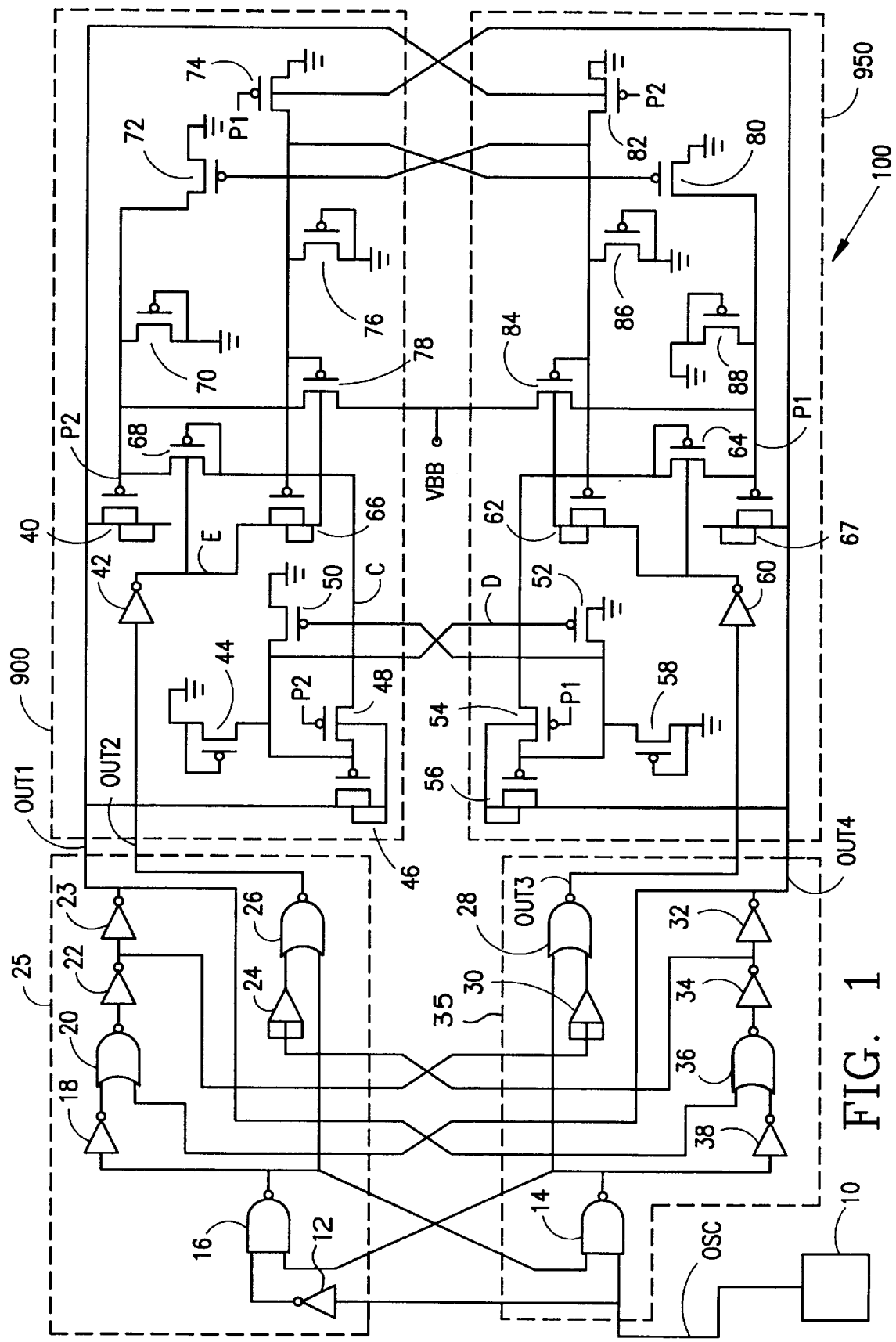
FIG. 1 is a detailed schematic of a preferred embodiment of a substrate bias generator in accordance with the present invention.

FIG. 1 illustrates a substrate bias generator 100 in accordance with a first embodiment of the present invention. Substrate bias generator 100 includes an oscillator 10 that supplies an alternating output or pump signal OSC to a charge pump constituting first and second phase circuits 25 and 35, respectively. Phase circuits 25 and 35, in turn, output pulses substantially 180° out of phase to drive first and second phase output circuits 900 and 950, respectively. In response to these pulses, first and second phase output circuits 900 and 950 alternately supply a negative substrate bias at node VBB.

The structure and operation of substrate bias generator 100 will be now be discussed in greater detail. As further shown in FIG. 1, oscillator 10, e.g., a ring oscillator, preferably outputs a train of voltage pulses OSC each having an amplitude equal to a positive power supply potential $V_{CC}$. Phase circuit 25, includes: inverters 12, 18, 22 and 23; NAND gate 16; delay circuit 24; NOR gates 20 and 26; and output nodes OUT1 and OUT2. The phase signal appearing at OUT2 is delayed by a time period associated with delay circuit 24 relative to the signal appearing at phase OUT1.

Phase circuit 35 has a similar construction to phase circuit 25. In particular, phase circuit 35 includes inverters 32, 34 and 38; NOR gates 36 and 28; NAND gate 14 and delay circuit 30. Phase signals appearing at output nodes OUT3 and OUT4 of phase circuit 35 are delayed with respect to each other by a time period associated with delay circuit 30, and are 180° out of phase with signals appearing at OUT1 and OUT2, respectively.

Phase circuits 25 and 35 insure that there is no overlap between the signals appearing at output nodes OUT1 and OUT4 (i.e., the two phase signals), as well as the signals appearing at output nodes OUT3 and OUT2. Instead of phase circuits 25 and 35, however, two oscillator circuits could be provided that output signals 180° out of phase. It may be difficult, however, to ensure that the outputs of separate oscillator circuits do not overlap one another. Thus, the phase circuits shown in FIG. 1 are preferred.

When oscillator 10 generates a low output, inverter 12 outputs a high potential, and, as a result, NAND gates 14 and 16 output high and low voltages, respectively. In response to the output of NAND gate 16, inverter 18 supplies a high potential to an input of NOR gate 20. NOR gate 20 also receives a high potential from the output of inverter 32, to be described in greater detail below. NOR gate 20, in turn, outputs a low voltage, which is inverted by inverter 22 and then inverted again by inverter 23 so that a low potential appears at OUT1.

The high potential output of NAND gate 14 is fed to inverter 38, which then outputs a low potential to NOR gate 36. NOR gate 36 also receives the low potential output from inverter 23, and, as a result, generates a high output to inverter 34. Accordingly, a low potential appears at the output of inverter 34, which is supplied to inverter 32 to generate a high potential at OUT4.

The low potential output of inverter 34 is also supplied to delay circuit 24, which preferably delays application of the inverter 34 output to NOR gate 26 by approximately 4 ns. Preferably, delay circuit 24 is one-sided so that it delays such low going transitions, but passes high-going transitions with little delay.

NOR gate 26 generates a high output approximately 4 ns after OUT1 goes low. This high output is then inverted by inverter 42. Likewise, the high output of inverter 22 is supplied to delay circuit 30, which is one-sided like delay circuit 24 and passes the high output of inverter 22 to NOR gate 28 with little delay. Thus, OUT3 goes low at approximately the same time OUT4 goes high. The voltage appearing at OUT3, however, is inverted by inverter 60.

When the output OSC of oscillator 10 goes low, OUT1 goes low and OUT2 goes high 4 ns after the transition of OUT1 from high to low. However, OUT4 goes high and OUT3 goes low at approximately the same time OUT4 transitions high. As will be described, the high outputs appearing at nodes OUT3 and OUT4 place capacitors in second phase output circuit 950 in a precharge state, whereby one electrode of each capacitor is at Vcc and the other is at ground. While in the precharge state, second phase output circuit 950 does not supply a negative potential at node VBB. Similarly, when the oscillator output OSC goes high, OUT1 and OUT2 go high, to place the capacitors in first phase output circuit 900 in the precharge state.

Figure 2:
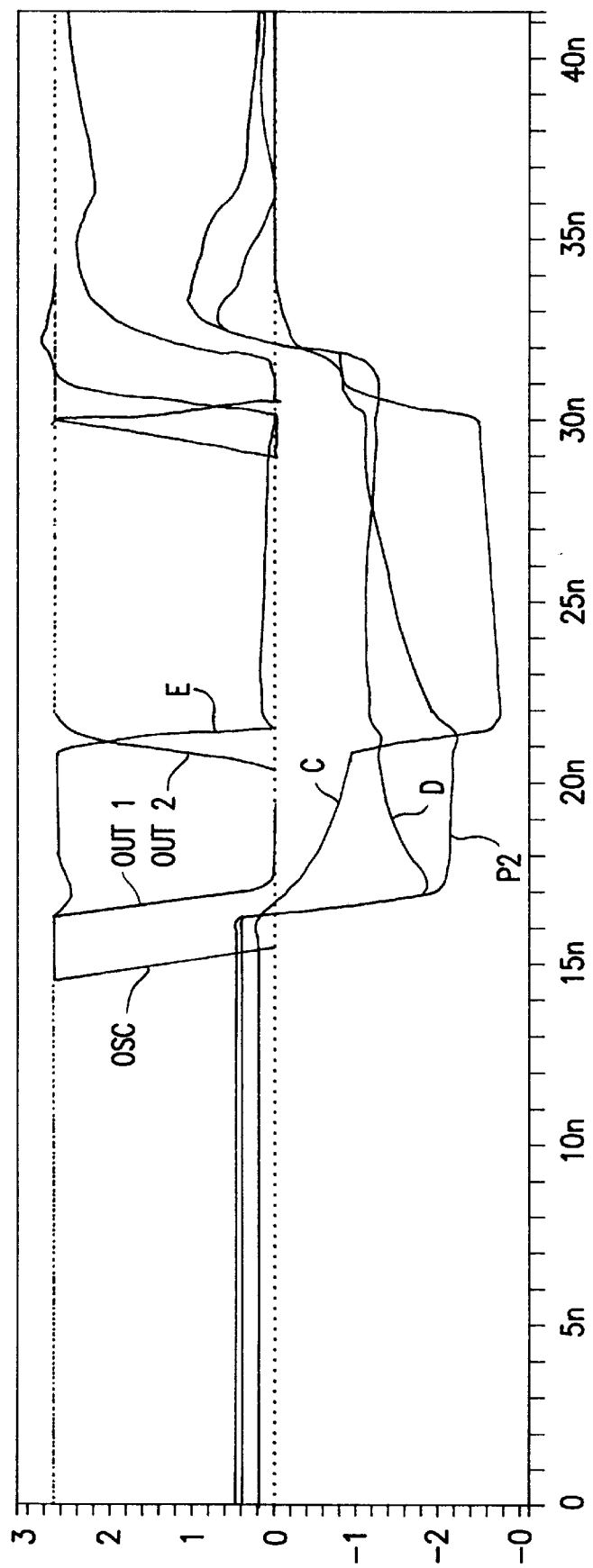
FIG. 2 illustrates simulated voltage waveforms at various nodes in the substrate bias generator 100 shown in FIG. 1.

A detailed description of the generation of a negative potential at node VBB by first phase output circuit 900 will be presented below with reference to FIGS. 1 and 2. It is to be understood that second phase output circuit 950 outputs a negative potential in a similar fashion as first phase output circuit 900 when nodes OUT3 and OUT4 go low, i.e., when the output of oscillator circuit 10 is high.

When oscillator output OSC goes low, however, the potential at node OUT1 also goes low shortly thereafter, as discussed above. The delay between the potential at node OUT1 and output OSC is due to the delay associated with the inverter and logic circuitry in phase circuit 25. The transition of OUT1 from a precharge high voltage of VCC to a low voltage of 0V causes a potential P2 (also serving as a charge sharing signal) at the gate electrode of a MIS capacitor 40 to transition from a precharge voltage 0V to approximately $-V_{CC}$ due to capacitive coupling between the two capacitor electrodes. Since the potential at OUT1 is applied to the source/drain electrodes of MIS capacitor 46, a similar transition begins to occur at node D connected to the gate electrode of an MIS boot capacitor 46. During the delay prior to the generation of a low output by inverter 42 (node E), the low potential at node P2 turns on charge sharing transistor 48 to couple the gate of MIS capacitor 66 (node C) to the gate of MIS capacitor 46, i.e., node D.

The high (VCC) to low (0V) transition of node OUT1 also causes the source/drain electrode of the first charge sharing capacitor 46 to similarly transition from to high to low, thereby causing a change in potential at the gate of MIS capacitor 46, node D. However, charge sharing occurs between MIS capacitors 46 and 66 through transistor 48, which is rendered conductive by the charge sharing signal (P2) so that the potentials at nodes C and D tend to converge to an intermediate or preboot voltage that is between 0 and $-V_{CC}$ (see FIG. 2), and not a full $-VCC$. This is due to the fact that, until node E transitions from high to low, capacitor 66 remains in the precharged state with is source/drain electrodes at VCC and its gate at ground. Preferably, the intermediate voltage is approximately −1 volt.

When node E transitions from high to low after the approximately 4 ns delay, node C is pulled down an additional $-V_{CC}$. The resulting negative potential at node C causes transistor 48 to turn OFF while strongly turning ON a pass transistor 78. Thus, the potential appearing at node P2, the charge sharing signal, can be supplied to the substrate through pass transistor 78 with little or no threshold voltage drop. As shown in FIG. 1, the substrate bias is supplied at node $V_{BB}$.

The charge sharing circuit including capacitors 46 and 66, as well as transistor 48, constitute a biasing circuit for supplying an appropriate voltage to the gate of pass transistor 78 so that the substrate voltage can be supplied with low loss. Alternatively, other biasing circuits capable of generating a strong negative potential could be used to drive the gate of pass transistor 78, thereby also improving efficiency of the charge pump.

A significant advantage of the present invention stems from the source/drain connection of MIS capacitor 46 to the n-well of charge sharing transistor 48. Due to this connection, when the potential at OUT1 goes low, the body effect of charge sharing transistor 48 is reduced, thereby reducing the threshold voltage of this device. As a result, charge is efficiently shared between MIS capacitors 46 and 66 while transistor 48 is turned ON. An appropriate intermediate voltage at node C can thus be obtained.

It should be noted that the reduced body effect could be achieved by coupling the n-well of transistor 48 to a switched node that is independent of the source/drain electrode of capacitor 46. The connection to source/drain electrode of capacitor 46, however, is a convenient means of supplying the requisite switched potential to the n-well of transistor 48.

A similar connection is made between the source/drain of capacitor 66 and the n-well of transistor 78. Consequently, as discussed above, the body effect and threshold voltage of transistor 78 is reduced so that charge can be more readily supplied from node P2 to node $V_{BB}$ through this transistor and efficiency of the charge pump can be improved. In addition, the magnitude of the maximum negative voltage the pump can supply is increased.

In accordance with a further aspect of the present invention, the source/drain of capacitors 46, 66 and 40 are also respectively tied to the n-wells associated with each of these capacitors. Thus, the p+ source/drain-n-well junction is shorted in each of these devices. Accordingly, the primary parasitic capacitance associated with each of these capacitors is that of the n-well-p substrate junction. The capacitance associated with the n-well-p substrate junction, however, is approximately 10 times less than the capacitance associated with the p+ source/drain-n-well junction. Therefore, the parasitic capacitance associated with each of capacitors 40, 46 and 66 is reduced significantly over conventional MIS capacitors having an associated n-well.

Figure 3:
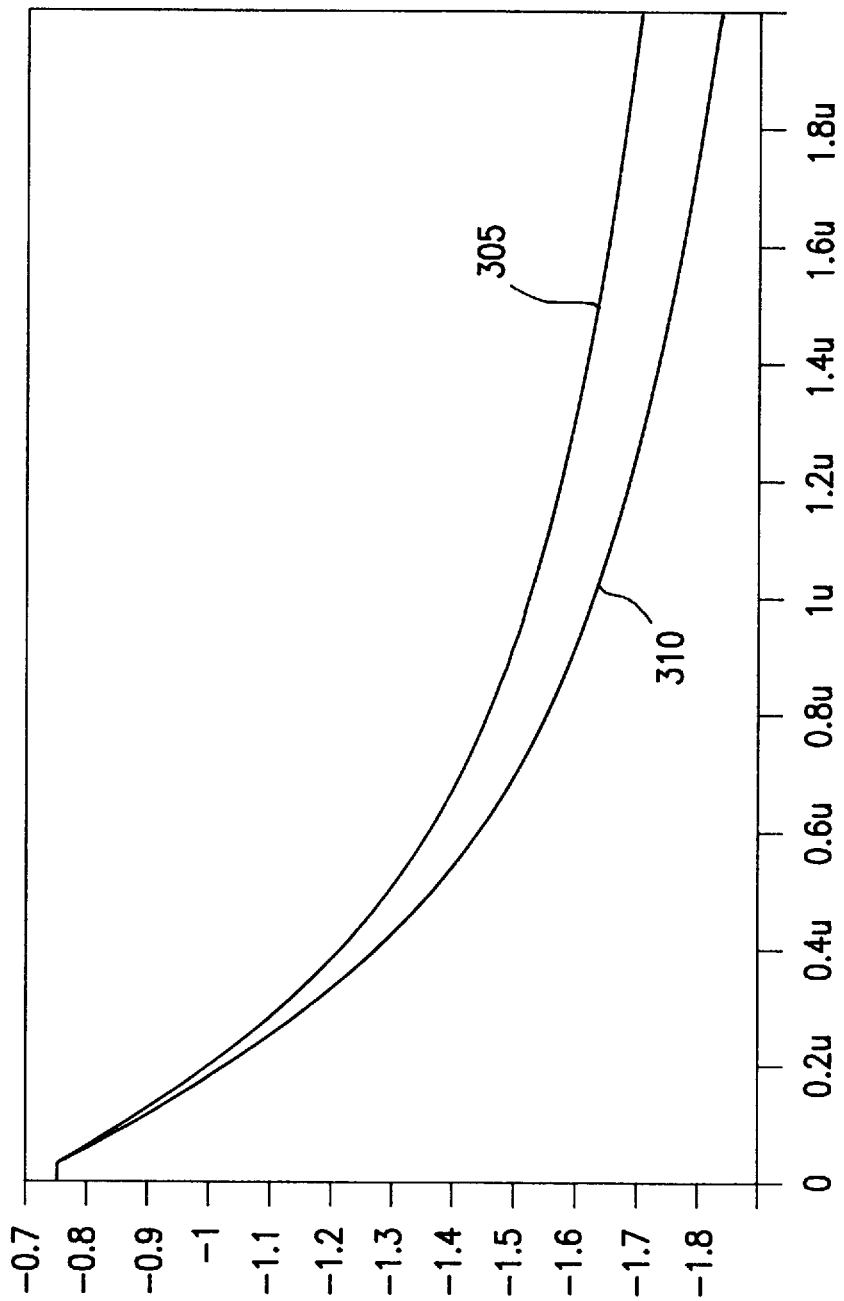
FIG. 3 illustrates plots of simulated voltage outputs of substrate bias generators.

The advantages of the present invention will be further described with reference to FIGS. 3–5. Curve 305 in FIG. 3 is a simulation of the potential at node $V_{BB}$ with the n-well of transistor 48 tied to $V_{CC}$ as a function of time, while curve 310 is a simulation of the potential at node $V_{BB}$ with the n-well of transistor 48 tied to the source/drain of capacitor 46 as a function of time. As seen in FIG. 3, the potential at node $V_{BB}$ drops significantly faster when the n-well transistor 48 is tied to the source/drain of capacitor 46, and it's final potential is more negative. Accordingly, the charge pump in accordance with the present invention supplies current at an improved rate that is faster than a pump without the above-described connection to the n-well. Further, the distance between curves 305 and 310, i.e., the "head-room", is increased, indicating a higher maximum potential supplied from the pump.

Figure 4:
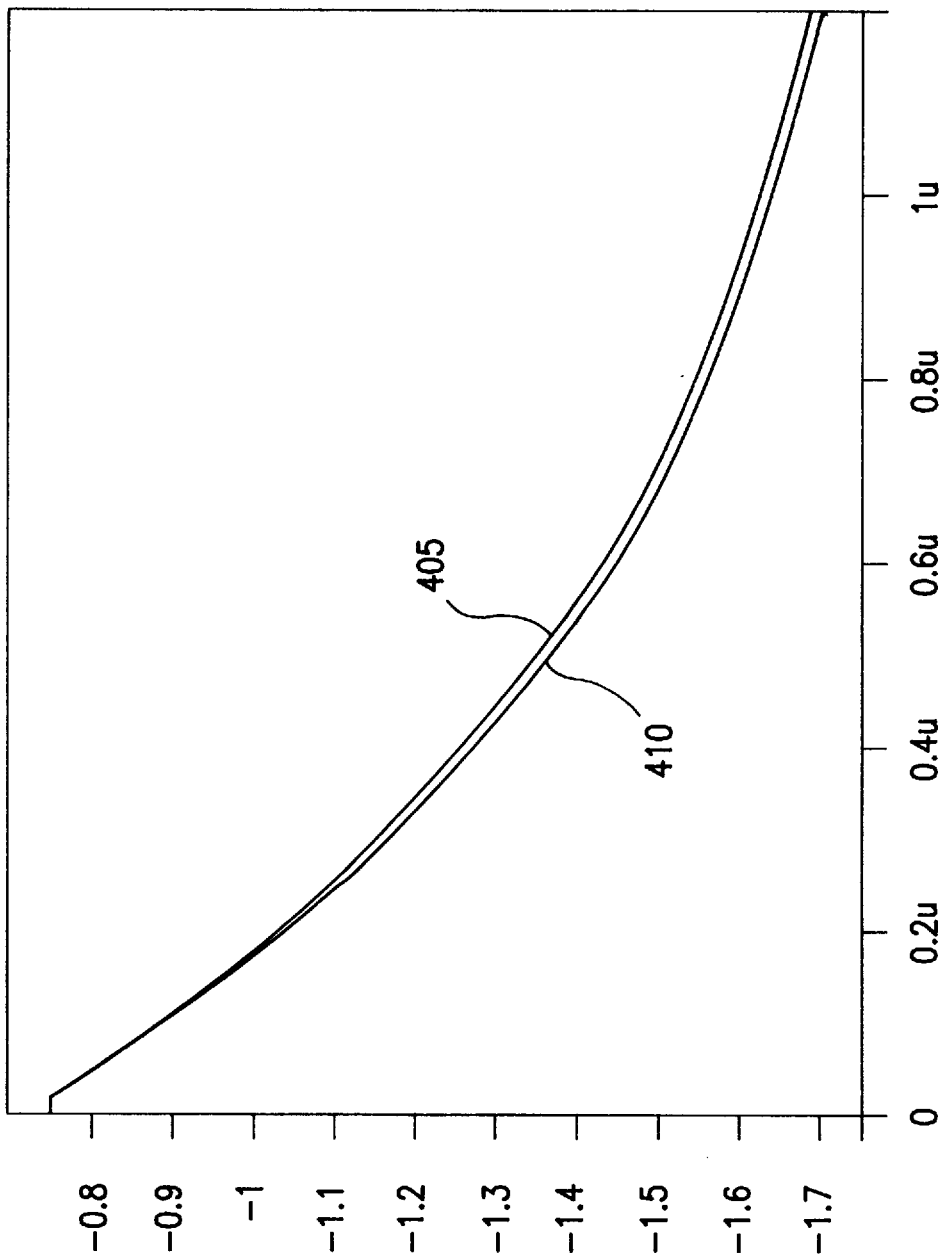
FIG. 4 illustrates plots of additional simulated voltage outputs of substrate bias generators.

FIG. 4 illustrates the improvement achieved in the present invention by tying the n-wells of capacitors 46, 40 and 66 to the source/drain electrodes in each of these devices. In particular, curve 405 in FIG. 4 corresponds to the potential at node $V_{BB}$, as a function of time, with the n-wells of capacitors 40, 66 and 46 tied to $V_{CC}$, but the n-well of transistor 78 tied to node E and the n-well of transistor 48 is tied to OUT1. Curve 410, on the other hand, is a simulation of the potential at node $V_{BB}$, as a function of time, with the n-wells of capacitors 40, 66 and 46 tied to their respective source/drain electrodes. As seen in FIG. 4, the potential at node $V_{BB}$ is drawn negative relatively faster with the n-wells tied to the source/drain electrodes of the capacitors than without this connection.

Figure 5:
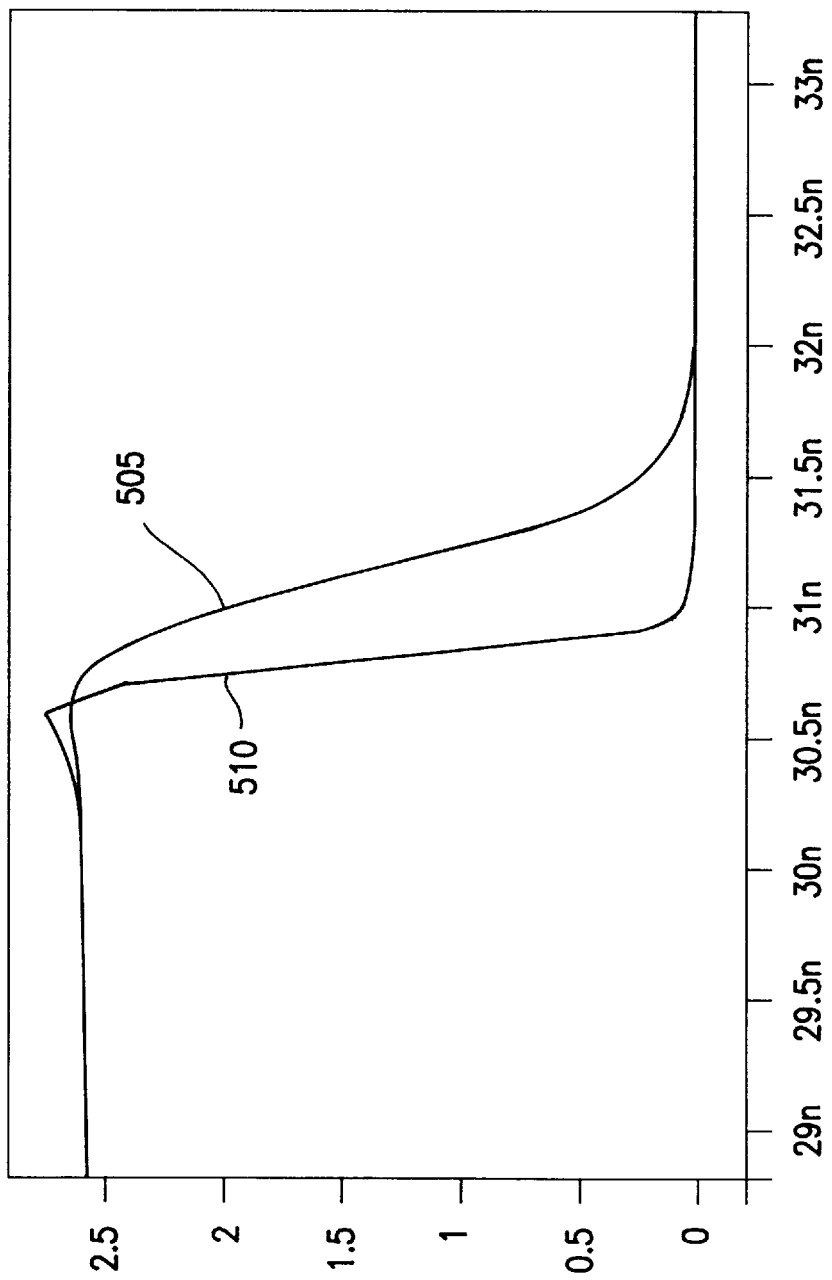
FIG. 5 illustrates plots of simulated voltage changes of the source/drain of an MIS capacitor of the present invention and a conventional MIS capacitor.

FIG. 5 further illustrates the improved switching speed of the capacitors in accordance with the present invention. Curve 505 represents the potential of node E as a function of time for capacitor 66 without the source/drain electrodes tied to the n-well, which corresponds to the potential at node E with the source/drain electrodes tied to the n-well. As seen in FIG. 5, curve 510 drops significantly faster than curve 505, indicating a faster switching speed for the capacitors in accordance with the present invention. This allows a smaller driver, which results in less switching current being wasted in the driver. Accordingly, the charge pump has improved efficiency and lower standby current.

Figure 6:
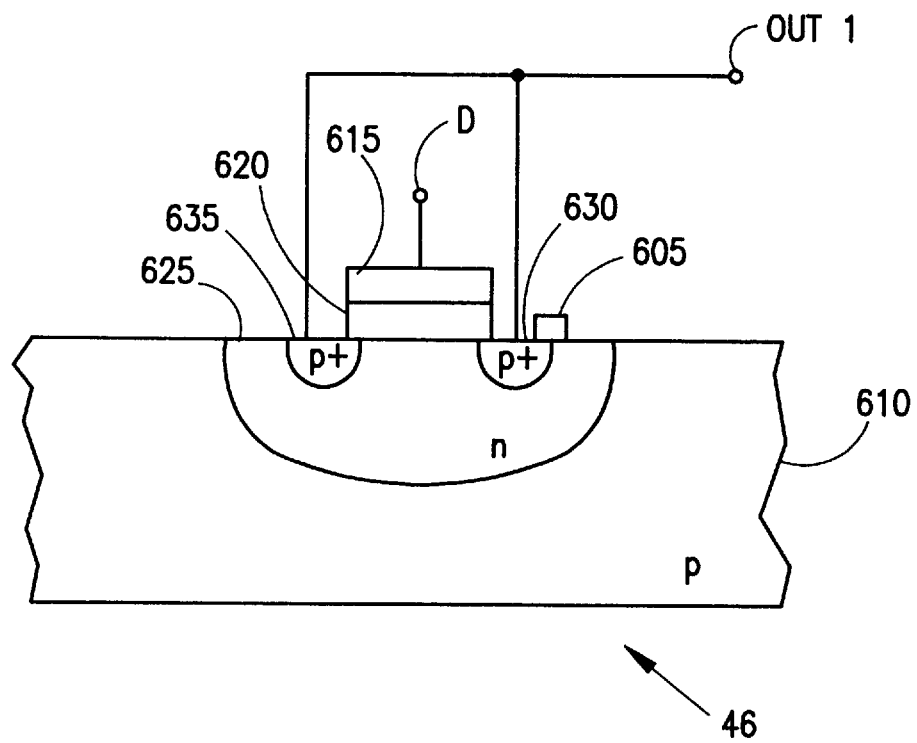
FIG. 6 is a cross-sectional view of an MIS capacitor included in the substrate bias generator shown in FIG. 1.

FIG. 6 is a cross-sectional view of capacitor 46 shown in FIG. 1. Preferably, capacitor 46 includes an n-well region 625 formed in p-type semiconductor substrate 610. First and second source/drain p+ regions 635 and 630 are formed spaced from each other in n-well 625. An insulating layer 620, preferably silicon dioxide, is provided on an portion of n-well region 625 between source/drain regions 635 and 630. Further, insulating layer 620 overlies portions of p+ source and drain regions 635 and 630. A gate electrode 615 is provided on insulating layer 620 such that it overlies the portions of regions 635 and 630 covered by gate insulating layer 620, as well as the portion of n-well region 625 between regions 635 and 630. The capacitance in this device arises from the overlaps of gate electrode 615 with regions 635 and 630. Preferably, regions 635 and 630 are tied to node OUT1 while the gate electrode is tied to node D. Further, a conductive layer 605 is provided that shorts at least one of regions 635 and 630 directly to n-well 625. As a result, the junction capacitance between one of regions 630/635 and n-well 625 is shorted out, thereby leaving the junction capacitance between the n-well 625 and p-type substrate 610. This is advantageous because, as noted above, the junction capacitance between the n-well and the p-type substrate is approximately 10 times less than the junction capacitance between regions 630/635 and n-well 625. Accordingly, parasitic capacitances in this device are significantly reduced. Preferably, MIS capacitors 40 and 66 have the same construction as capacitor 46 shown in FIG. 6.

Figure 7:
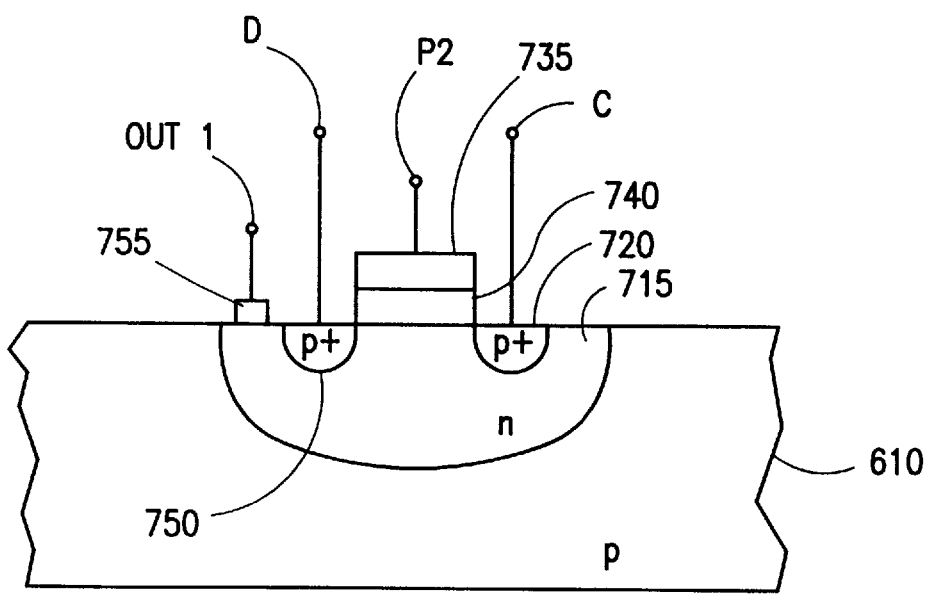
FIG. 7 is a cross-sectional view of a transistor included in the substrate bias generator shown in FIG. 1.

FIG. 7 illustrates transistor 48 in greater detail. Transistor 48 is preferably a p-channel MIS transistor including p+ source/drain regions 720 and 750 formed in n-well 715. Gate electrode 735 is insulated from n-well 715 by insulating layer 740, and preferably connected to node P2, as discussed above. Source/drain regions 720 and 750 are preferably connected to nodes C and D, respectively, while n-well 715 is tied to OUT1 through conductive layer 755. Accordingly, as noted above, when OUT1 goes low, the body effect of transistor 48 is reduced, thereby reducing the threshold voltage of transistor 48 as well. Thus, charge sharing through transistor 48 is improved such that sufficient preboot voltage is supplied to the gate of pass transistor 78.

Returning to FIG. 1, additional circuitry in substrate bias generator 100 will now be described. Starting with transistor 44, this device has its gate tied to a grounded drain electrode while its source is connected to node D. With this configuration, node D is clamped within a threshold voltage of ground during the precharge phase of phase circuit 25. In addition, transistor 44 supplies an initial charge to capacitor 46 during power-up so that this capacitor is charged when OUT1 goes low. Capacitor 46, however, initially loses one Vt, and has little or no effect after power-up is completed. Transistors 70 and 76 perform similar clamping and initial charging functions for capacitors 40 and 66, respectively.

Precharge transistor 50 has its gate connected to the gate electrode of capacitor 56, and its drain and source electrodes connected to a reference voltage or ground and node D respectively. When node OUT4 is pulled negative, the gate of capacitor 56 is also pulled negative. Accordingly, the gate electrode of transistor 50, which is connected to the gate electrode of capacitor 56, is pulled down sufficiently so that a ground potential is supplied to the gate of capacitor 46. Accordingly, since OUT1 is at VCC during the precharge cycle of first phase output circuit 900, a full $V_{CC}$ is supplied across capacitor 46. Thus, when the oscillator output OSC goes low at the end of the precharge cycle of first phase output circuit 900, the gate electrode of capacitor 46 is pulled down to the full preboot voltage.

Precharge transistors 72 and 74 function in a similar manner as transistor 50. Namely, transistor 72 has its gate electrode connected to the gate of capacitor 62, and the potential appearing thereon can be considered a precharge voltage. The gate of transistor 74 is connected to node P1. Accordingly, the gates of transistors 72 and 74 are pulled down sufficiently negative when OUT4 goes low such that ground potential is supplied to the gates of capacitors 40 and 66, and a full $V_{CC}$ is supplied across these devices. Thus, when OUT1 goes low, node P2 is pulled to negative VCC and the gate of capacitor 66 is pulled down to the full preboot voltage.

Preferably, the n-wells of transistors 74 and 82 are connected to OUT4 and OUT1, respectively, to improve the resulting layout of the circuit.

Second phase output circuit 950 includes circuits which mirror those found in the first phase pump circuits discussed above, and operate in substantially the same way as first phase circuit 900. Namely, capacitors 56 and 62 constitute charge sharing capacitors corresponding to capacitors 46 and 66, respectively. Charge sharing transistor 54, with its gate electrode connected to node P1, corresponds to charge sharing transistor 48. In addition, pump capacitor 67 corresponds to boot capacitor 40 and pass transistor 84 corresponds to pass transistor 78. It should be noted that both transistors 78 and 84 have their substrates connected to the source/drain regions of capacitors 66 and 62, respectively, in order to reduce the body effect and threshold voltage of these devices, and thereby ensuring that maximum charge is supplied to node $V_{BB}$. Inverter 60 inverts the delayed output appearing at node OUT3 to the source/drain regions of capacitor 62 in a manner similar to that of inverter 42. Clamping transistors 58, 88 and 86 correspond to transistors 44, 70 and 76, respectively, and transistors 52, 80 and 82 correspond to transistors 50, 72 and 74, respectively.

In accordance with yet a further embodiment of the present invention, an improved voltage generator supplying a potential greater than the power supply Vcc, i.e., a Vccp generator will now be described with reference to FIG. 8.

Figure 8:
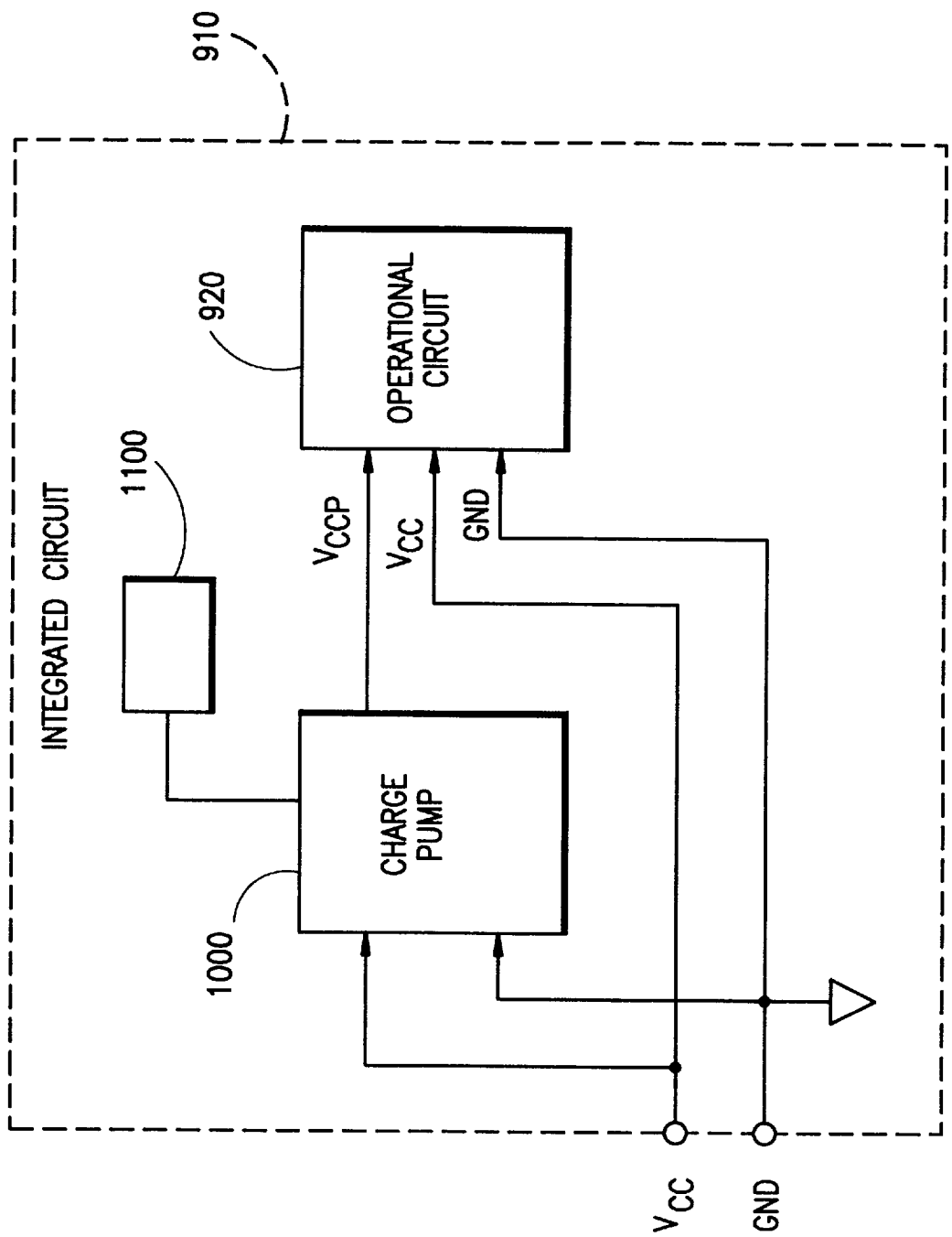
FIG. 8 is a block diagram of an additional embodiment of the present invention.

Integrated circuit 910 of the present invention, as shown in FIG. 8, has a charge pump 1000, an oscillator 1100 and an operational circuit 920. The operational circuit can be any functional circuit, for example, a DRAM or VRAM. The charge pump converts Vcc provided by an external power supply into a higher potential Vccp. The operational circuit, therefore, has both Vcc and Vccp supply voltages available.

Figure 9:
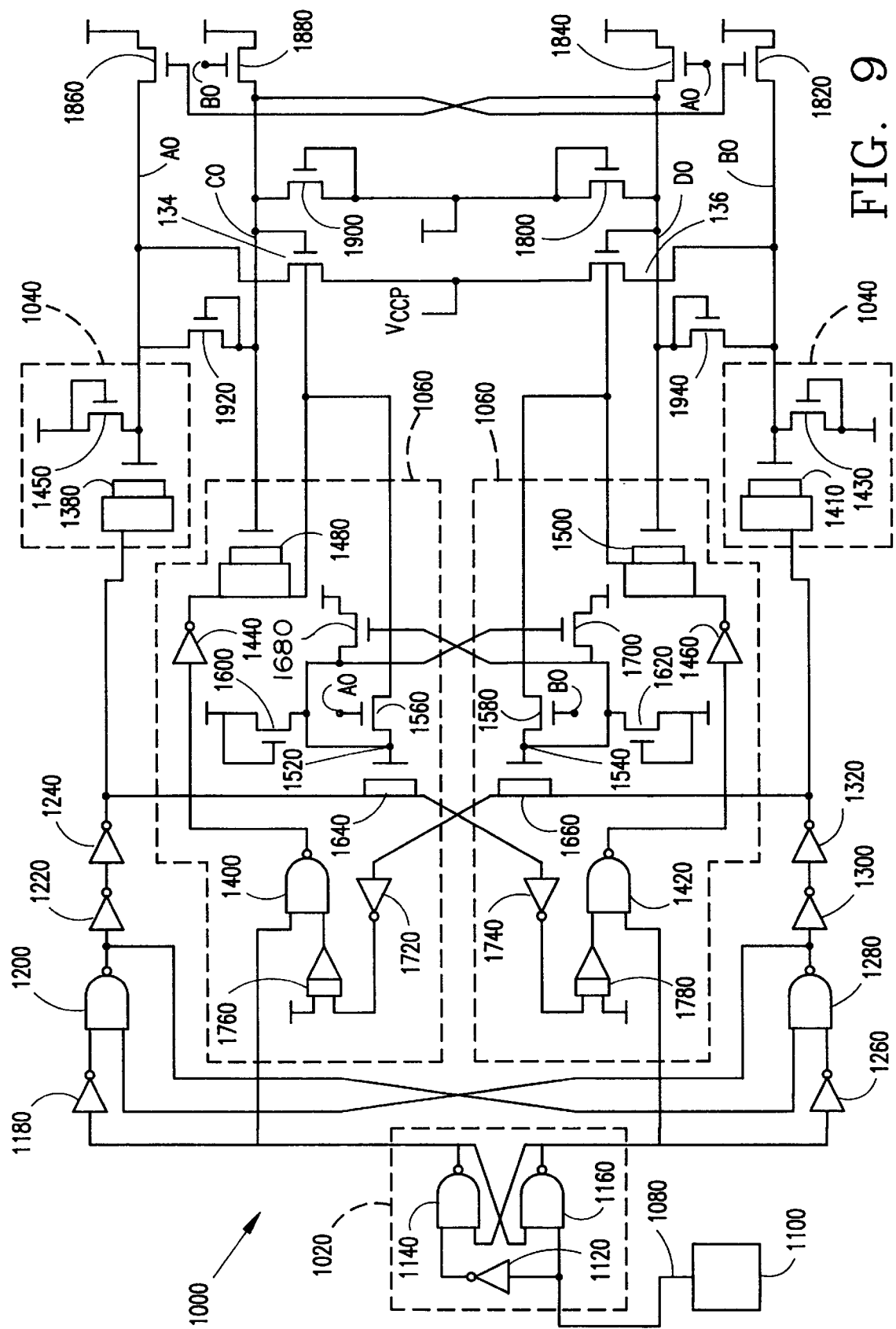
FIG. 9 is a detailed schematic of the circuit shown in FIG. 8.

Referring to FIG. 9, the charge pump 1000 includes a two phase generator 1020, two phase boot circuits 1040, two charge sharing gate driver circuits 1060, and additional circuitry. The phase generator receives an oscillating signal and produces two logical phases therefrom. The charge pump is designed symmetrically, such that, during a first phase, the pump provides a pump voltage Vccp using one-half of the pump circuit and, during the second phase, Vccp is provided using the other-half of the circuit.

Figure 10:
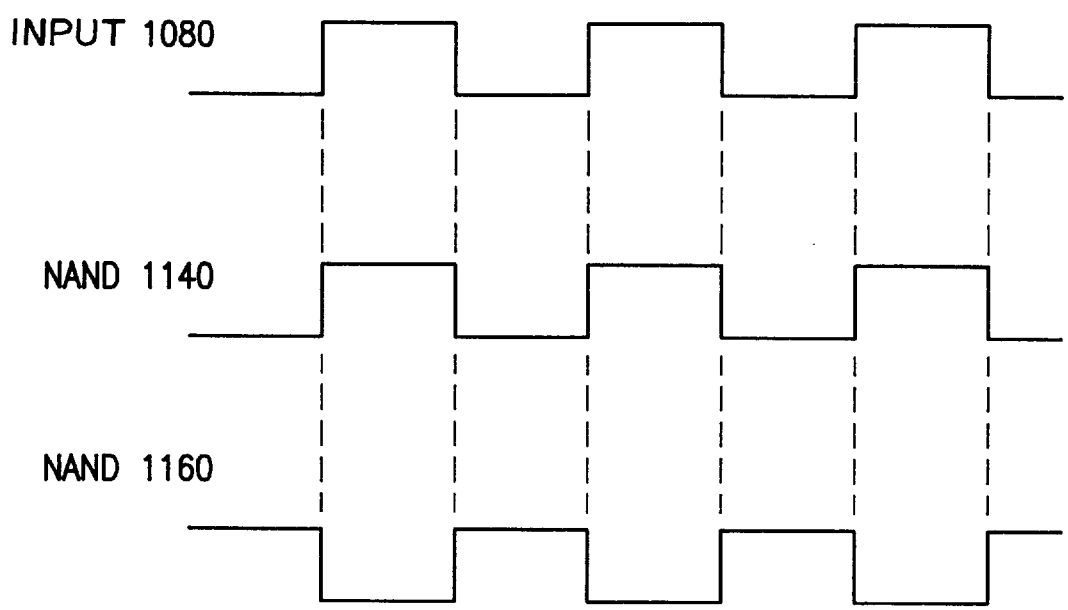
FIG. 10 includes timing diagrams of the outputs of various circuit components shown in FIG. 9.

The two phase generator 1020 has an input 1080 for receiving an oscillating signal produced by oscillator 1100 located on the integrated circuit 910. NAND gates 1140 and 1160, formed as a flip flop, use inverter 1120 and the oscillator input to latch and produce outputs of opposite states. These outputs are directly connected to one of the charge sharing gate driver circuits 1060, and indirectly connected to both a charge sharing gate driver circuit 1060 and one of the phase boot circuits 1040 using a flip flop circuit, as discussed below. FIG. 10 illustrates the outputs of NAND gates 1140 and 1160 in response to the input from oscillator 1100. When the input is high, the output of NAND gate 1140 is also high while the output of NAND gate 1160 is low. Likewise, when the input is low, the output of NAND gate 1140 is low while the output of NAND gate 1160 is high.

The outputs of NAND gates 1140 and 1160 are connected to inverters 1180 and 1260. Gates, 1200 and 1280 are interconnected to form a flip flop, such that the outputs of inverters 1240 and 1320 are latched to the same state as the inputs to inverters 1180 and 1260, respectively. The outputs of each of inverters 1240 and 1320 are connected to separate charge sharing gate driver circuits 1060 and a phase boot circuits 1040.

Phase boot circuits 1040 provide the source voltage to output transistors 134 and 136 via nodes A0 and B0 during one phase of the charge pump, as described below. Output or pass transistors 134 and 136 each provide the charge pump output Vccp during one phase of the charge pump. Each phase boot circuit 1040 has a N-channel transistor 1380 or 1410 formed as a pump capacitor. The phase boot circuits also have a charging transistor 1450 or 1430 for pre-charging the pump capacitors.

The charge sharing gate driver circuits 1060 are unique circuits used to drive the gate voltage on output transistors 134 or 136 via nodes C0 and D0. The gate voltage, therefore, must be at least a threshold voltage (vt) above the source voltage to provide a maximum voltage Vccp.

Charge sharing gate driver circuits 1060 have a NAND gate 1400 or 1420 connected to the output of NAND gates 1140 or 1160, respectively. The output of NAND gates 1400 or 1420 are connected to either inverters 1440 or 1460 which, in turn, are each coupled to nodes C0 and D0 through either capacitor 1480 or 1500. Nodes C0 and D0 are also connected to the drains of transistors 1560 and 1580, respectively. The gate of transistor 1560 is connected to Node A0 and its source (node 1520) is connected to both the gate of MIS capacitor 1640 and the drain of transistor 1600. Likewise, the gate of transistor 1580 is connected to node B0 and its source (node 1540) is connected to both the gate of MIS capacitor 1660 and the drain of transistor 1620. Transistors 1600 and 1620 have their gates and sources connected to Vcc. Further, the drains of transistors 1600 and 1620 are cross-coupled to transistors 1680 and 1700.

Capacitors 1640 and 1660 are connected to both the output of inverters 1240 and 1320, respectively, and the input of inverters 1740 and 1720, respectively. The output of inverter 1720 is connected to delay element 1760, which is connected to an input of NAND gate 1400. Inverter 1740 is a mirror circuit of inverter 1720. That is, the output of inverter 1740 is connected to delay element 1780, which is connected to an input of NAND gate 1420. Delay elements 1760 and 1780 can be any delay element, but is preferably an RC network.

Additional circuit elements shown in FIG. 8 will be described below as the operation of the charge pump is detailed.

Figure 11:
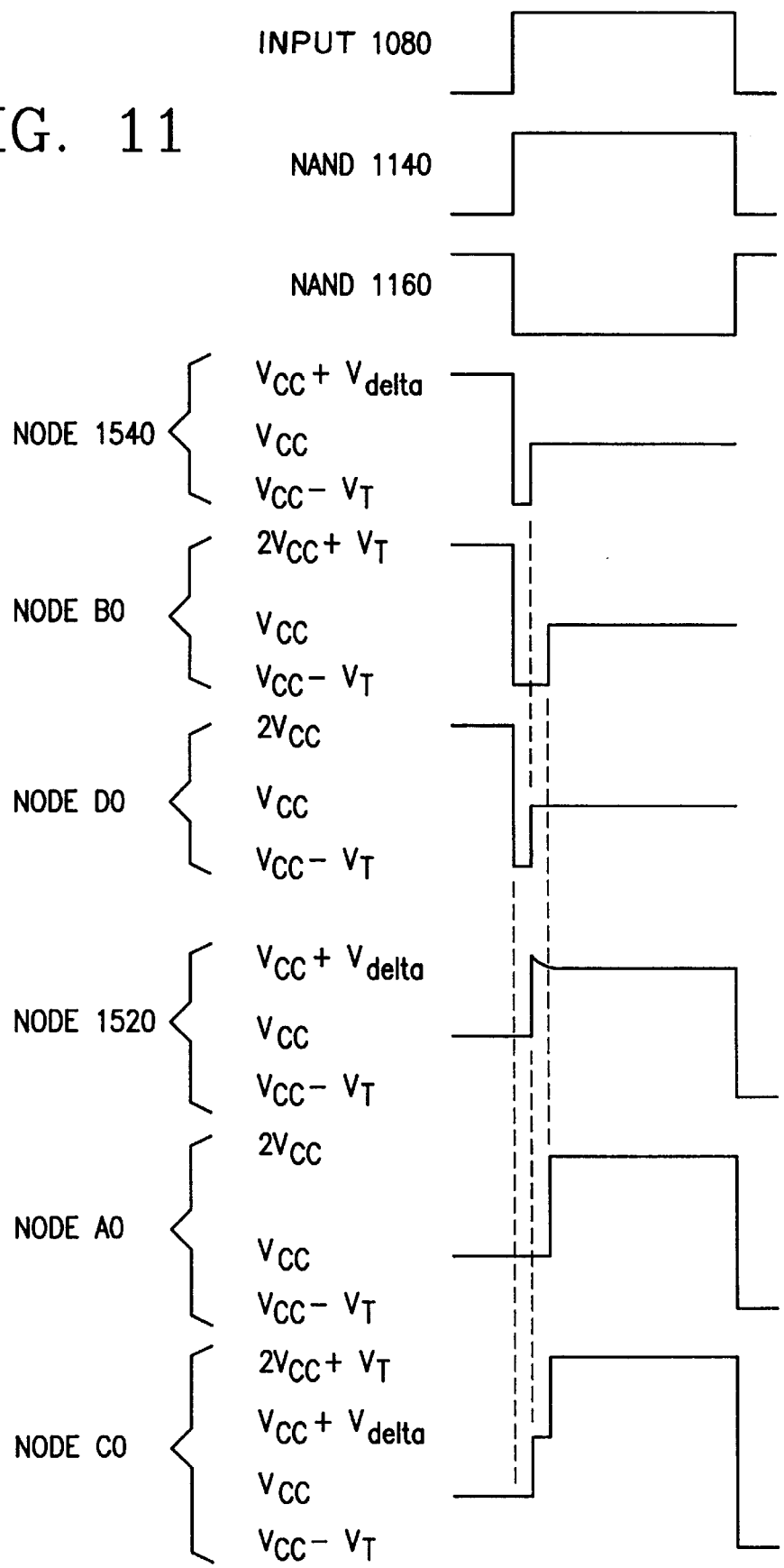
FIG. 11 includes voltage waveforms at various nodes in the circuit shown in FIG. 9.

Charge pump 1000 is a two phase circuit, therefore, only one half of the charge pump is producing Vccp at any given time. The first phase is herein defined as the time when the output of NAND gate 1140 is high and the second phase is defined as the time when the output of NAND gate 1160 is high. To understand the operation of the charge pump, the transition from the second phase to the first phase is detailed and shown in FIG. 11.

To initiate the first phase, the oscillating input 1080 transitions from a low state to a high state. The output of inverter 1120, therefore, goes low. As stated above, the output of NAND gate 1140 goes high, and the output of NAND gate 1160 goes low. When the output of NAND gate 1140 goes high, inverter 1180 goes low, NAND gate 1200 goes high, inverter 1220 goes low and inverter 1240 goes high. Likewise, as the output of NAND gate 1160 goes low, inverter 1260 goes high, NAND gate 1280 goes low, inverter 1300 goes high and inverter 1320 goes low.

The output of NAND gate 1420 goes high and the output of inverter 1460 thus goes low. Node D0, coupled through capacitor 1500, is, however, clamped to a potential equal to Vcc minus a threshold voltage Vt by transistor 1800. That is, transistor 1800, having its gate and source connected to Vcc, has a drain voltage of Vcc−Vt, such that capacitor 1500 maintains a charge equal thereto.

Node B0 is coupled through pump capacitor 1410 as the output of inverter 1320 goes low. Node B0 is, however, clamped to Vcc−Vt by transistor 1430 so that capacitor 1410 maintains a charge of Vcc−Vt. Similarly, capacitor 1660 maintains a charge of Vcc−Vt through transistor 1620. Capacitors 1410, 1500, and 1660 are all ultimately charged to Vcc through transistors 1820, 1840 and 1700, respectively, as explained below.

Pump capacitor 1380 and Node A0 have been pre-charged to Vcc through transistor 1860 during the previous phase. Node A0 is booted to a higher voltage through capacitor 1380 as the output of inverter 1240 goes high. This higher voltage is preferably 2Vcc. Likewise, because capacitor 1640 has been pre-charged to Vcc, the voltage at node 1520 is booted higher. The charge on capacitor 1640 is shared with capacitor 1480, through transistor 1560 when its gate voltage increases as a result of Node A0 being booted to 2Vcc. Because capacitor 1480 was pre-charged to Vcc, the resultant charge on capacitor 1480 is Vcc+Vdelta, where Vdelta is preferably at least threshold voltage Vt.

As a result of inverter 1320 going low, the output of inverter 1720 goes high. This signal is delayed by delay element 1760 and provided as an input to NAND gate 1400. It is during this delay that capacitor 1480 is charged to Vcc+Vdelta. With both inputs high, the output of NAND gate 1400 goes low and the output of inverter 1440 goes high. The resultant increase in voltage on capacitor 1480 boots node C0 to a maximum voltage of 2Vcc+Vt. This maximum is ensured through clamping transistor 1920. Node C0 provides gate voltage for transistor 134. Transistor 134, having a source voltage of 2Vcc and a gate voltage of 2Vcc+Vt, provides a maximum Vccp voltage at its drain.

Transistor 1820 charges pump capacitor 1410 to Vcc when node C0 exceeds Vcc+Vt. Likewise, capacitor 1500 is charged to Vcc through transistor 1840 when the node A0 exceeds Vcc+Vt. Further, capacitor 1660 is charged to Vcc through transistor 1700 when node 1520 exceeds Vcc+Vt.

It will be recognized that the charge pump is mirrored about the outputs of NAND gates 1140 and 1160. As a result, the operation of the circuit is substantially the same during the second phase. That is, capacitors 1410, 1500 and 1660 are booted so that transistor 136 provides a Vccp voltage of up to 2Vcc and capacitors 1380, 1480 and 1640 are pre-charged to Vcc.

Typical values for voltages referred to herein are, Vcc=3 volts, Vccp=4.5 volts, and Vt=0.7 volts. It will be understood that different voltage levels could be used and are not intended to limit the scope of the present invention.

As further shown in FIG. 9, the source/drain of capacitor 1480 is connected to a p-well associated with transistor 1340 that is preferably formed by a triple well process described below. Accordingly, when the output of inverter 1440 goes high, the potential of the p-well also goes high to lower the body effect of the transistor and reduce the threshold voltage. Accordingly, transistor 1340 passes charge to node VCCP with minimal threshold voltage drop. The performance of transistor 1360 is similarly improved by a connection of its p-well to the source/drain of capacitor 1500.

Figure 12:
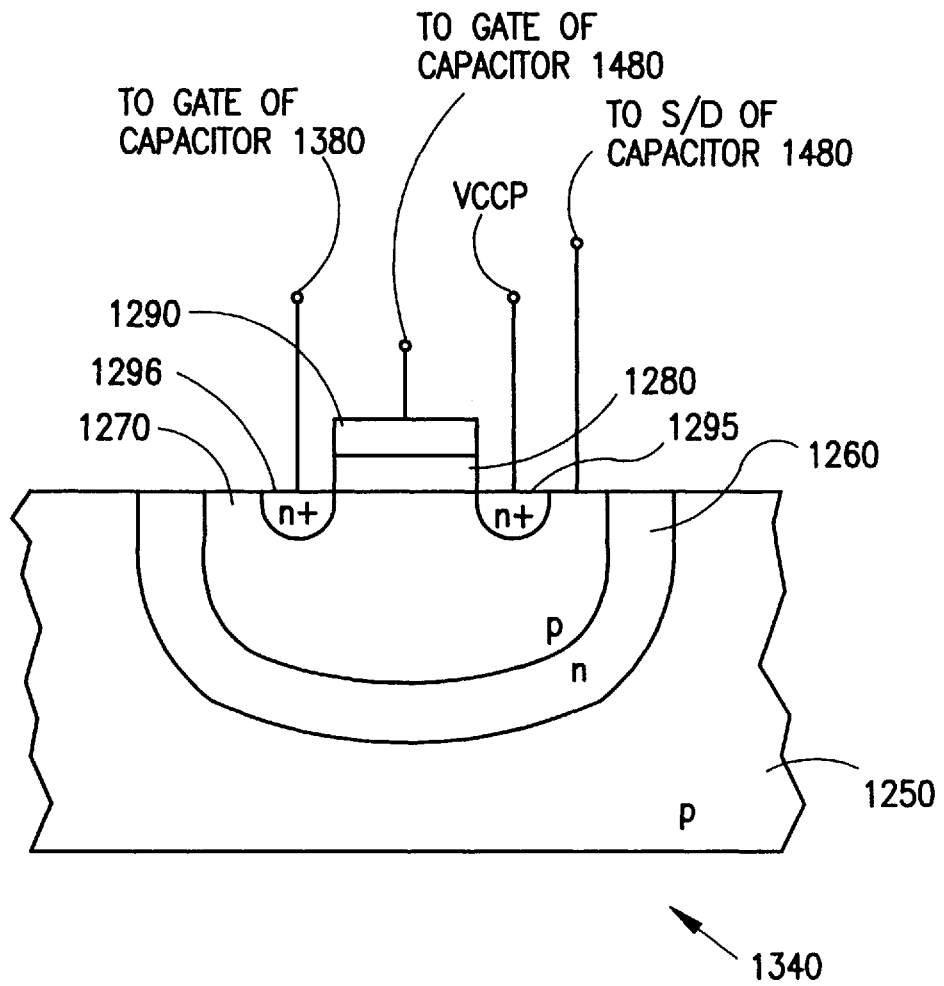
FIG. 12 is a cross-sectional view of a transistor included in the circuit shown in FIG. 9.

Transistor 134 is shown in greater detail in FIG. 12. N+ source/drain regions 1295 and 1296 are formed in p-type well region 1270, which, in turn, is formed in n well 1260. Substrate 1250 is preferably p-type. N+ regions 1296 and 1295 are preferably connected to the gate of capacitor 1380 and the source/drain of capacitor 1480, respectively, while gate 1290 is connected to the gate of capacitor 1480. As noted above, p well 1296 is connected to the source/drain of capacitor 1480, to lower the body effect of transistor 134 and reduce the threshold voltage. Transistor 136 has a structure similar to that of transistor 134, but has an associated p well connected to the source drain electrode of capacitor 1500.

Figure 13:
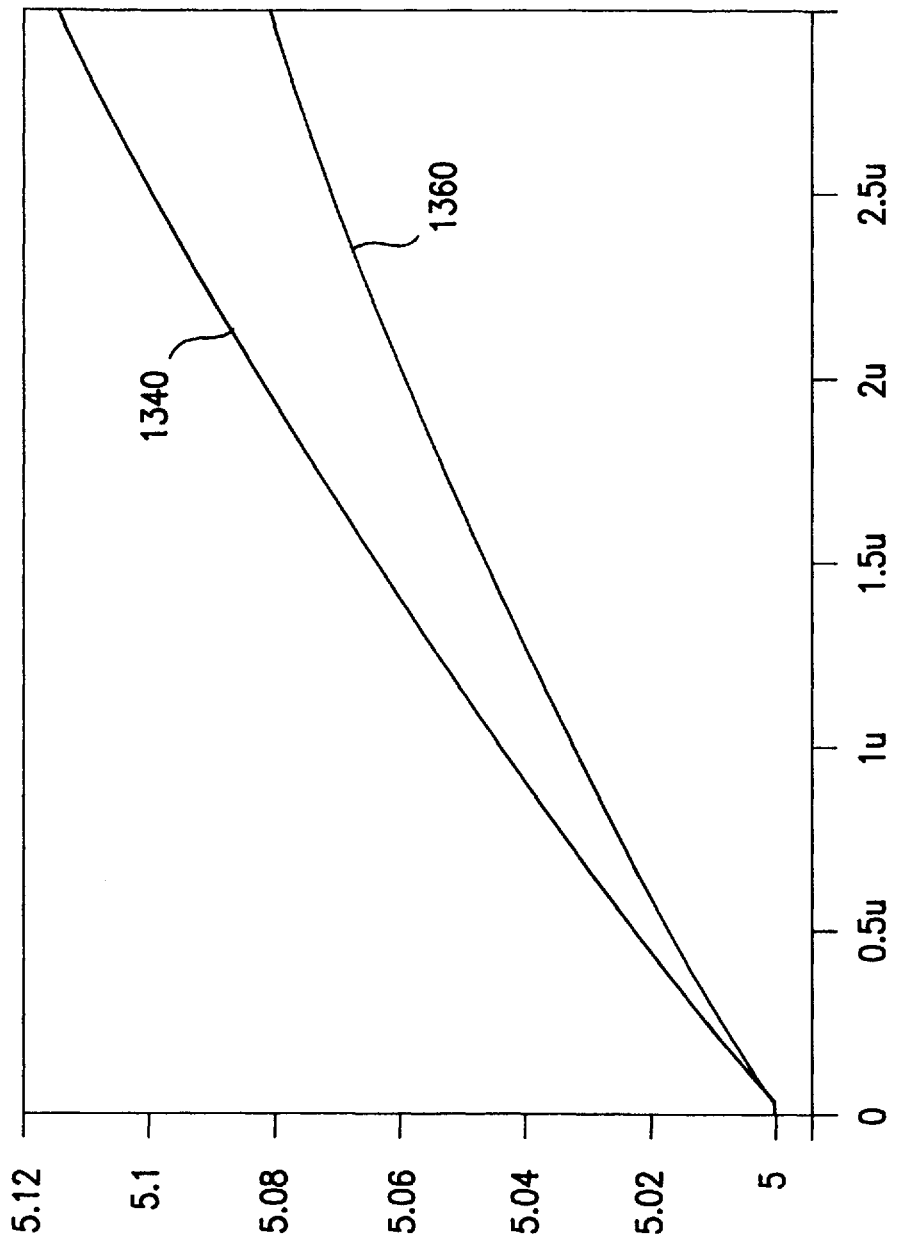
FIG. 13 illustrates plots of the outputs of the circuit shown in FIG. 9 and a conventional Vccp pump.

FIG. 13 illustrates simulations of the potential at node VCCP with the p well of transistor 134 connected to the source/drain of capacitor 1480 (curve 1340), and without this connection (curve 1360). Curve 1340 rises faster than curve 1360 indicating a higher VCCP can be achieved in accordance with the present invention in a relatively short time. A similar result is achieved with transistor 136.

It will be apparent to those skilled in the art that various modifications and variations can be made in the charge pump of the present invention and in construction of this charge pump without departing from the scope or spirit of the invention. As an example, instead of coupling the transistor well regions to capacitor electrodes, as discussed above, the well regions could be tied to an intermediate potential between ground and Vcc, but the charge pump would be less efficient.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising:
   a semiconductor substrate of a first conductivity type having a primary surface;
   a well region of a second conductivity type in said semiconductor substrate at said primary surface;
   a first doped region of said first conductivity in said well region;
   a second doped region of said first conductivity type in said well region, said second doped region spaced from and electrically connected to said first doped region;
   an insulation layer on said primary surface of said substrate overlying respective portions of said first and second doped regions and a portion of said well region between said first and second doped regions;
   a gate electrode on said insulation layer over said respective portions of said first and second doped regions and at least a part of said portion of said well region between said first and second doped regions; and
   a conductive layer electrically shorting at least one of said first and second doped regions to said well region.

2. A semiconductor device in accordance with claim 1, wherein said first conductivity type is p conductivity type and said second conductivity type is n conductivity type.

3. A semiconductor device in accordance with claim 1, wherein said first and second doped regions constitute a first capacitor electrode of an MIS capacitor, said insulator constitutes a dielectric portion of said MIS capacitor, and said gate electrode constitutes a second capacitor electrode of said MIS capacitor.

4. A semiconductor integrated circuit comprising:
   a semiconductor substrate;
   a well region of a first conductivity type in said substrate;
   a transistor including:
     a source region of a second conductivity type in said well region;
     a drain region of a second conductivity type in said well region spaced from said source region; and
     an insulated gate electrode overlying a portion of said well region between said source and drain regions, said insulated gate receiving a charge sharing signal; and
   a first charge sharing capacitor having a first capacitor electrode electrically connected to said well region to adjust a body effect of said transistor, and coupled to receive a voltage signal, and a second capacitor electrode connected to one of said source and drain regions; and
   a second charge sharing capacitor having a first capacitor electrode coupled to another one of said source and drain regions, and a second capacitor electrode.

5. A semiconductor integrated circuit in accordance with claim 4, wherein said second capacitor electrode of said second charge sharing capacitor is coupled to receive said voltage signal, and said voltage signal is delayed by a predetermined time duration.

6. A semiconductor integrated circuit in accordance with claim 5, further comprising:

a precharge transistor having a drain electrode coupled to a reference voltage, a gate electrode receiving a precharge signal, and a source electrode, said source electrode precharged to a predetermined level in response to said precharge signal;
a boot capacitor having a first electrode coupled to said source electrode of said precharge transistor, and a second electrode coupled to said voltage signal; and
a pass transistor having a gate electrode coupled to said other one of said source and drain regions and said second capacitor electrode of said first capacitor, a source electrode connected to said first electrode of said boot capacitor, and a drain electrode, said drain electrode supplying a potential to said semiconductor substrate corresponding to a voltage appearing at said first electrode of said boot capacitor.

7. A semiconductor integrated circuit, comprising:
   an phase circuit generating an alternating voltage signal;
   a boot capacitor having a first electrode coupled to receive said alternating voltage signal and a second electrode;
   a first p-channel MOS transistor having a first terminal coupled to a reference voltage, a control terminal receiving a precharge signal, and a second terminal coupled to said second electrode of said boot capacitor, said second terminal being precharged to a predetermined level in response to said precharge signal,
   a second p-channel transistor having a first terminal connected to said second electrode of said boot capacitor, a control terminal, and a second terminal;
   a biasing circuit supplying a control signal to said control terminal of said second p-channel transistor of a voltage magnitude that is greater than a voltage magnitude of said alternating voltage signal,
   wherein a voltage appearing at said second electrode of said boot capacitor is passed to said second terminal of said second p-channel transistor substantially without a threshold voltage drop.

8. A semiconductor integrated circuit in accordance with claim 7, further comprising a semiconductor substrate, wherein said voltage appearing at said second electrode of said boot capacitor is supplied to said semiconductor substrate.

9. A semiconductor integrated circuit in accordance with claim 7, wherein said biasing circuit comprises:
   a first charge-sharing capacitor having a first electrode receiving said alternating voltage and a second electrode;
   a switching element having a first terminal connected to said second electrode of said first charge-sharing capacitor, a gate electrode receiving a charge-sharing signal, and a second terminal; and
   a second charge-sharing capacitor having a first electrode coupled to receive said alternating voltage delayed by a predetermined duration, and a second electrode, said second terminal of said switching element and said second electrode of said second charge-sharing capacitor connected in common to an output node of said biasing circuit, said output node coupled to supply said control signal to said gate of said second p-channel transistor.

10. A semiconductor integrated circuit in accordance with claim 9, further comprising:
   a semiconductor substrate having a first conductivity type; and
   a well region having a second conductivity type, wherein said first and second terminals of said switching element include first and second doped regions, respectively, in said well region, and said first electrode of said first charge sharing capacitor is electrically connected to said well region.

11. A semiconductor device in accordance with claim 9, further comprising:
   a semiconductor substrate having a first conductivity type; and
   a well region having a second conductivity type,
   wherein said first electrode of said boot capacitor includes a region of said first conductivity type formed in and electrically connected to said well region.

12. A semiconductor device in accordance with claim 9, further comprising:
   a semiconductor substrate having a first conductivity type; and
   a well region having a second conductivity type,
   wherein said first electrode of said first charge-sharing capacitor includes a region of said first conductivity type formed in and electrically connected to said well region.

13. A semiconductor device in accordance with claim 9, further comprising:
   a semiconductor substrate having a first conductivity type; and
   a well region having a second conductivity type,
   wherein said first electrode of said second charge-sharing capacitor includes a region of said first conductivity type formed in and electrically connected to said well region.

14. A semiconductor device in accordance with claim 9, wherein said charge-sharing signal is a potential signal including said voltage appearing at said second electrode of said boot capacitor.

15. A semiconductor device comprising:
   a semiconductor substrate having a first conductivity type;
   a first well region of a second conductivity type in said substrate;
   a second well region of said first conductivity type in said first well region;
   a transistor including:
      a first doped region of said second conductivity type in said second well region;
      a second doped region of said second conductivity type in said second well region spaced from said first doped region; and
      an insulated gate overlying a portion of said second well region between said first and second doped regions; and
   a capacitor formed in association with said substrate and spaced from said insulated gate, said capacitor having an electrode electrically connected to said second well region.

16. A semiconductor device in accordance with claim 15, wherein said electrode connected to said second well region is further connected to receive a signal, and said capacitor is adapted to produce a voltage on another electrode of said capacitor in response to said signal.

17. A semiconductor device in accordance with claim 16, wherein said transistor is configured to have a reduced body effect upon receipt of said signal.

18. A semiconductor device in accordance with claim 16, wherein said another electrode is coupled to said insulated gate, and said voltage is supplied to said insulated gate to render said transistor conductive.

19. A semiconductor integrated circuit comprising:
   a semiconductor substrate;
   a well region of a first conductivity type in said substrate;
   a transistor including:
      a source region of a second conductivity type in said well region;
      a drain region of a second conductivity type in said well region spaced from said source region; and
      an insulated gate electrode overlying a portion of said well region between said source and drain regions, said insulated gate receiving a charge sharing signal;
   a switched potential node coupled to said well region for reducing a body-effect of said transistor; and
   a first charge sharing capacitor coupled to one of said source and drain regions; and
   a second charge sharing capacitor coupled to the other of said source and drain regions.

20. A semiconductor integrated circuit in accordance with claim 19, wherein said first charge sharing capacitor has a first capacitor electrode coupled to receive a voltage signal, and a second capacitor electrode coupled to said one of said source and drain regions,
   and said second charge sharing capacitor has a first capacitor electrode coupled to said other one of said source and drain regions, and a second capacitor electrode coupled to receive said voltage signal, said voltage signal being delayed by a predetermined duration.

21. A semiconductor integrated circuit in accordance with claim 20, further comprising:
   a precharge transistor having a drain electrode coupled to a reference voltage, a gate electrode receiving a precharge signal, and a source electrode, said source electrode precharged to a predetermined level in response to said precharge signal;
   a boot capacitor having a first electrode coupled to said source electrode of said precharge transistor, and a second electrode coupled to said voltage signal; and
   a pass transistor having a gate electrode coupled to said other one of said source and drain regions and said second capacitor electrode of said first capacitor, a source electrode connected to said first electrode of said boot capacitor, and a drain electrode, said drain electrode supplying a potential to said semiconductor substrate corresponding to a voltage appearing at said first electrode of said boot capacitor.

22. A semiconductor device in accordance with claim 9, further comprising:
   a semiconductor substrate having a first conductivity type; and
   a well region having a second conductivity type,
   wherein said first electrode of said first charge-sharing capacitor includes a region of said first conductivity type electrically connected to said well region.

* * * * *

UNITED STATES PATENT AND TRADEMARK OFFICE
CERTIFICATE OF CORRECTION

PATENT NO. : 5,828,095
DATED : October 27, 1998
INVENTOR(S) : Todd Merritt

It is certified that error appears in the above-identified patent and that said Letters Patent is hereby corrected as shown below:

In the Drawings:

Delete Fig. 9, and substitute therefor Fig. 9, as shown on the attached page.

Signed and Sealed this

Eleventh Day of April, 2000

*Attest:*

Q. TODD DICKINSON

*Attesting Officer*     *Director of Patents and Trademarks*

UNITED STATES PATENT AND TRADEMARK OFFICE
CERTIFICATE OF CORRECTION

PATENT NO : 5,828,095
DATED : October 27, 1998
INVENTOR(S): Todd Merritt

It is certified that error appears in the above-identified patent and that said Letters Patent is hereby corrected as shown below:

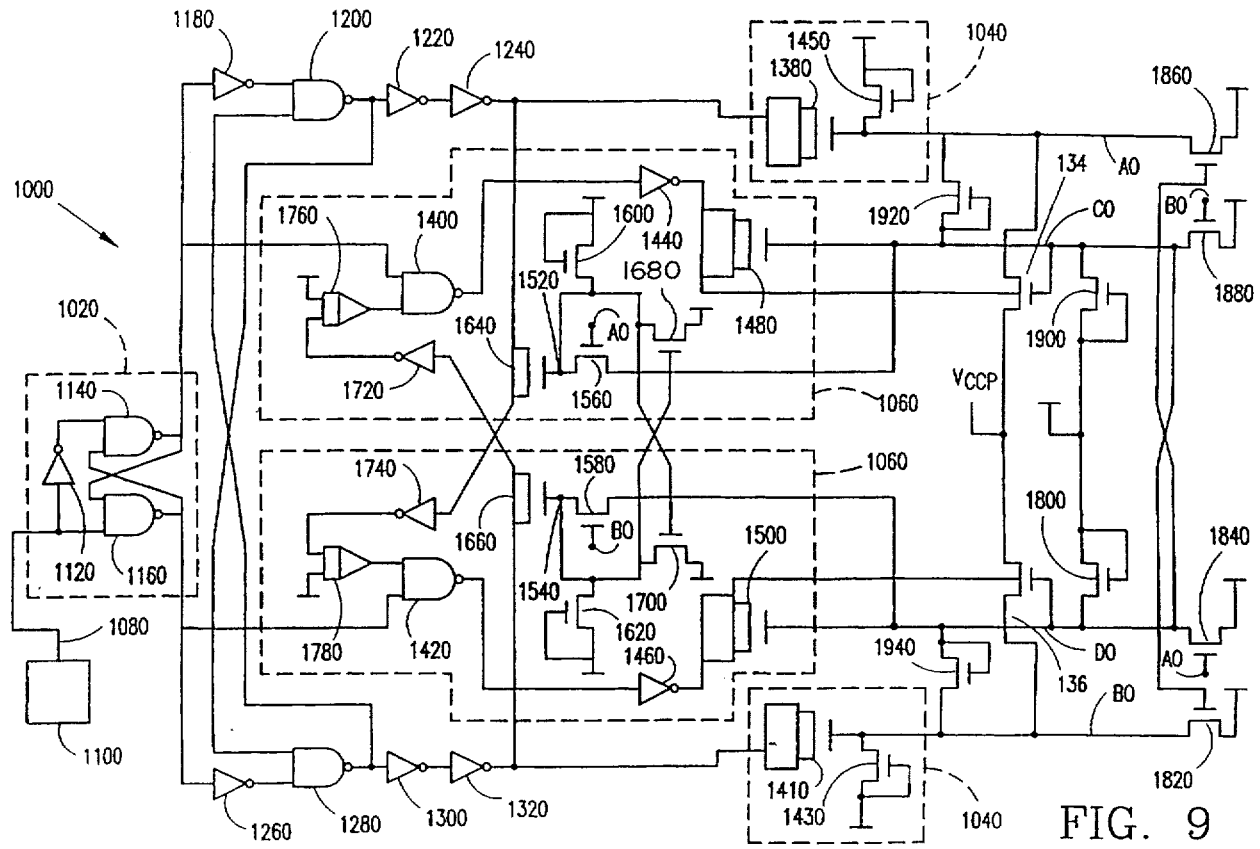

FIG. 9